United States Patent [19]

Kelly

[11] Patent Number: 4,649,413

[45] Date of Patent: Mar. 10, 1987

[54] MOS INTEGRATED CIRCUIT HAVING A METAL PROGRAMMABLE MATRIX

[75] Inventor: John C. Kelly, Johnson City, Tenn.

[73] Assignee: Texas Instruments Incorporated, Dallas, Tex.

[21] Appl. No.: 527,159

[22] Filed: Aug. 29, 1983

[51] Int. Cl.[4] .................... H01L 27/02; H01L 27/10
[52] U.S. Cl. ...................................... 357/41; 357/45; 357/40; 357/46
[58] Field of Search .................. 357/41, 68, 45, 46, 357/40

[56] References Cited

U.S. PATENT DOCUMENTS

| | | | |
|---|---|---|---|
| 4,053,336 | 10/1977 | Grundy et al. | 357/45 |
| 4,278,897 | 7/1981 | Ohno et al. | 357/45 |
| 4,500,906 | 2/1985 | Ohno et al. | 357/68 |
| 4,510,517 | 4/1985 | Tanabe et al. | 357/68 |

Primary Examiner—Martin H. Edlow
Assistant Examiner—Terri M. Henn
Attorney, Agent, or Firm—James P. McAndrews; John A. Haug; Melvin Sharp

[57] ABSTRACT

An MOS integrated circuit has an array of terminal means connectable to an output buffer or the like arranged around an array of MOS circuit components such as shift registers or the like and has a novel metal programmable matrix arranged for compactly and economically accommodating any selected interconnection of the shift registers and terminal pins at the metal conductor level of the integrated circuit.

9 Claims, 3 Drawing Figures

MOS INTEGRATED CIRCUIT HAVING A METAL PROGRAMMABLE MATRIX

BACKGROUND OF THE INVENTION

The field of this invention is that of metal-oxide-semiconductor (MOS) integrated circuits and the invention relates more particularly to an MOS integrated circuit having a large number of terminal pins or the like arranged in an array around an array of shift registers or the like and having a novel metal programmable matrix arranged for accommodating interconnection of any of the outputs of the shift registers with any of the terminal pins in an advantageously compact and economical manner.

Where known MOS integrated circuits have had MOS circuit elements forming components such as shift registers or the like and have had a large number of the shift registers arranged in an array to be connected with a large number of terminal pins or the like such as the input pins of an output buffer, the integrated circuit structure has typically provided metal conductor means connecting the respective register outputs and the output buffer input pins to a gate programmable logic array and has then programmed the logic array as necessary to provide the desired interconnection of the register outputs with the buffer input pins. In that arrangement, the basic integrated circuit structure has been programmable for achieving desired versatility but the amount of interconnecting metal conductor means required in the structure has made the circuit bar or chip size relatively large, the programming has been required at the gate level of the integrated circuit structure, and the system has required provision of extra MOS elements embodied in the logic array. In other known MOS integrated circuits, data buss lines for the respective registers have been run around the registers. Conductors from the register outputs and from the inputs to the output buffer pins or the like have then been run under each of the busses. Each of those conductors has been provided with potential contact areas formed by thin oxide coatings at a proposed juncture with each data buss and the system has then been programmed in a multistep process requiring opening of selected thin oxide coatings to provide a selected programmed contact pattern followed by provision of the metal data buss means to connect to the contact pattern to complete the programming. Again the programming procedure is unduly slow and there is risk of a yield problem such as may be caused by the occurrence of too thin oxide coatings at the potential contact areas which are not actually used in forming contact openings.

SUMMARY OF THE INVENTION

It is an object of this invention to provide a novel and improved MOS integrated circuit having an improved interconnection system; to provide such an integrated circuit having a metal programmable matrix for use in compactly interconnecting an array of MOS circuit components such as a group of shift registers to any selected circuit components in a second array in an improved manner; and to provide such an improved integrated circuit having an economical and reliable structure.

Briefly described the novel and improved MOS integrated circuit of this invention comprises a substrate of semiconducting material of one conductivity type having a plurality of MOS circuit elements provided in the substrate to form a relatively large number of MOS circuit components such as shift registers or the like. A plurality of second circuit components such as terminal means to be connected to input pins of an output buffer or the like are provided on the substrate to form a second array. Preferably, a relatively large number of shift registers are arranged in columns and rows to form the first array and a corresponding number of terminal pins are arranged in a line extending along one or more sides of the first array for forming the second array. First diffused regions of other conductivity type are provided in the substrate material for defining first conductors which extend a selected limited distance from each shift register or other MOS component in the first array and electrically insulating means are provided on the substrate material over the first diffused regions. First contact openings are provided in the coating means over remote ends of the first conductors for permitting electrical connection to be made to the first conductors through the contact openings. In a preferred embodiment, where the shift registers are arranged in an array of columns and rows, the first conductors serve as register outputs and preferably extend from each of two opposite ends of each shift register for a short distance substantially less than the spacing of the shift register from shift registers in adjacent columns of the array. The first conductors are also oriented so that conductive metal means or the like to be electrically connected to the first conductors of the shift registers in each row of the first array are adapted to extend through respective first conductor path zones which preferably extend across the first array in spaced parallel relation to each other in transverse relation to the columns of shift registers in the first array. In a preferred embodiment, metal conductive means extending from the first conductors of one register are adapted to pass over, under or through adjacent registers in the array where required.

In accordance with this invention, a plurality of second diffused regions of said other conductivity type are provided in the substrate under the insulating coating means for defining second conductor elements. The second conductor elements are arranged in groups so that there is one group for each of the second circuit components in the second array. The second conductor elements in each group are aligned or sequentially arranged in a line in spaced relation to each other in the substrate so that the lines formed by the respective groups extend parallel to the columns of the shift registers or other MOS components in the first array. At least some of the groups of second conductor elements are preferably disposed so that said lines extend between the columns of shift registers or other components in the first array. The second conductor elements in each group are also arranged so that the elements extend across the respective first conductor path zones under the insulating coating means so that conductive metal means arranged over the coatings in the zones are electrically insulated from the second elements. The insulating coating means have second contact openings therein over respective opposite ends of each of the second conductor elements for permitting electrical connection to be made to each end of each element. In one preferred embodiment, a conductor element of each group is electrically connected a respective circuit component of the second alloy.

As thus described, the first and second conductors form a metal programmable matrix and accordingly, in accordance with this invention, conductive metal means are provided on the insulating coating means and electrically connected to the first and second conductors through the noted contact openings for providing any selected interconnection of any of the shift register outputs or group of outputs to any of the terminal pins or group of terminal pins in a compact and economical manner. The conductive metal means have first portions connected to selected first conductors through selected first contact openings forming first conductive paths which extend lengthwise along the noted first conductor path zones. Such first portions of the conductive metal means extending from one shift register in a row are extended through over or under an adjacent register in the same row as may be desired. The conductive metal means also have second portions electrically connecting selected ends of adjacent second conductor elements together within respective groups for forming second conductive paths in matrix or layered relation to the first conductive paths. The conductive metal means also have third portions which extend laterally with respect to the first conductive path zones at selected locations for electrically connecting selected first conductive paths with second conductive paths.

In that way the MOS integrated circuit of this invention is programmable at the metal level so that integrated circuit units provided with the desired arrays and metal programmable matrix can be prepared and made available for prompt completion at any time by addition of conductive metal means to adapt the circuit unit for use in specific applications. The integrated circuit is also of compact size and economical structure.

DESCRIPTION OF THE DRAWINGS

Other objects, advantages and details of the novel and improved MOS integrated circuit of this invention appear in the following detailed description of preferred embodiments of the invention, the detailed description referring to the drawings in which.

DESCRIPTION OF THE PREFERRED EMBODIMENTS

Figure 1:
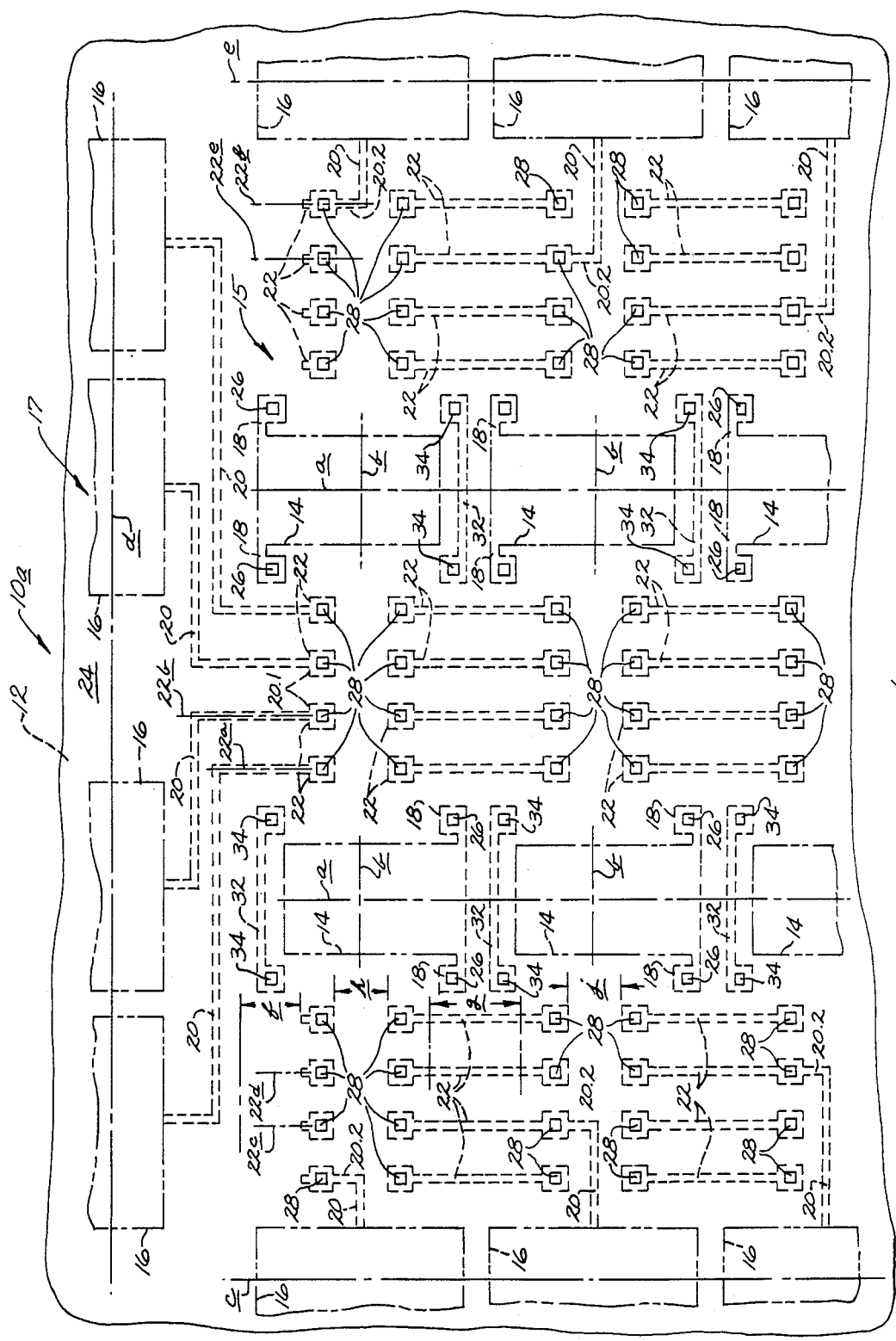
FIG. 1 is a partial schematic view of an MOS integrated circuit unit in accordance with this invention illustrating provision of a metal programmable matrix for use in interconnecting components of two arrays in any selected manner.
Figure 2:
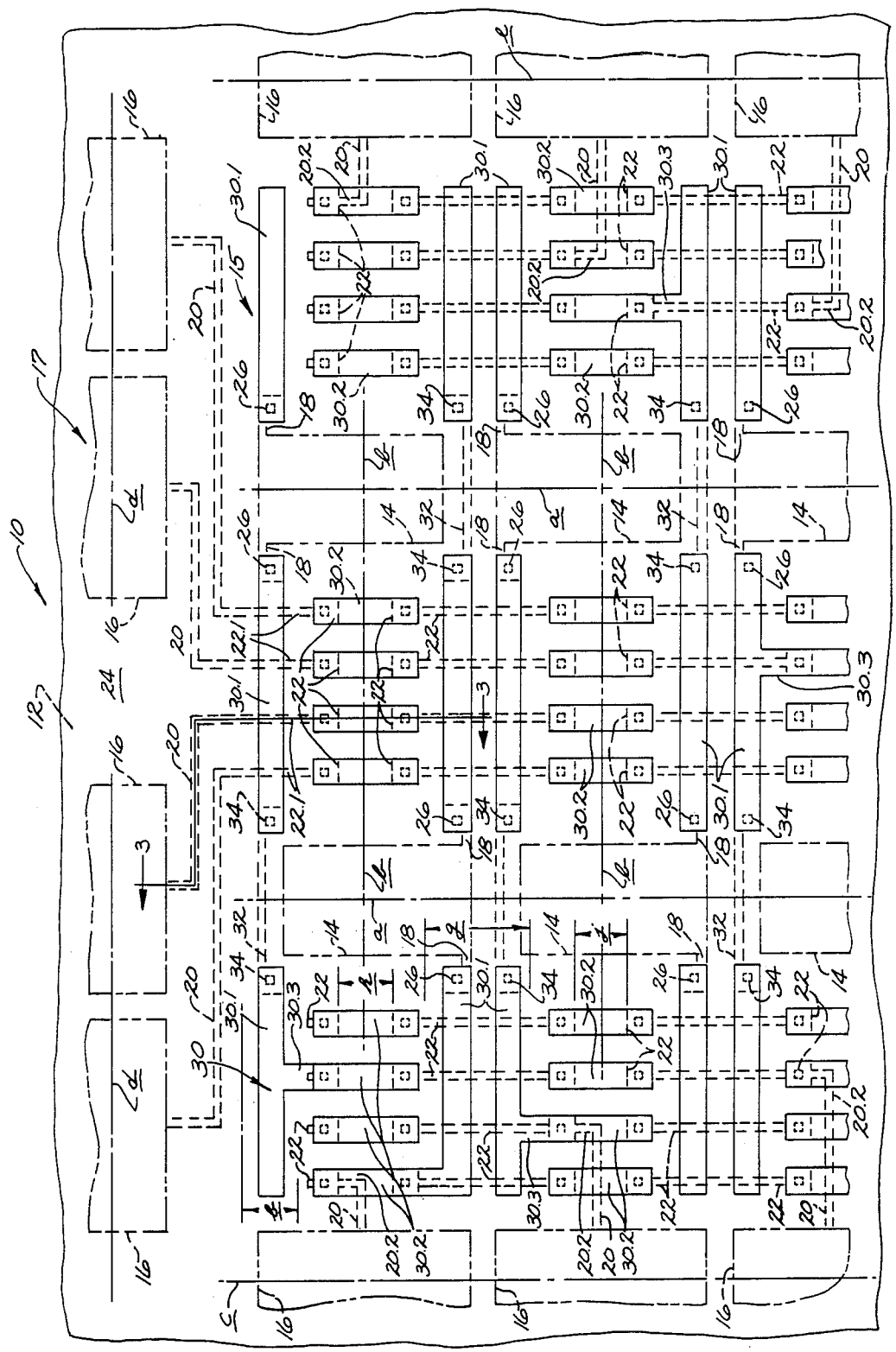
FIG. 2 is a partial schematic view of the MOS integrated circuit unit of FIG. 1 incorporating conductive metal means interconnecting the components in an exemplary manner.

Referring to the drawings, 10 in FIG. 2 indicates the novel and improved MOS integrated circuit of this invention which is shown to include a substrate 12 of a selected semiconducting material of a first conductivity type. A plurality of first MOS circuit components 14 are arranged on the substrate to form a first array 15 and a plurality of second circuit components 16 are arranged in a second array 17. Typically for example, the substrate 12 comprises N-type silicon and the MOS circuit components 14 each comprise individual MOS elements (not shown) arranged to form shift registers or the like diagrammatically indicated by the broken lines 14 in FIGS. 1 and 2. In accordance with this invention, the first MOS circuit components 14 are arranged in a plurality of columns as indicated by centerlines a in FIG. 1 and a plurality of rows as indicated by centerlines b in FIG. 1. Typically the second circuit components 16 comprise input pins to an output buffer or the like which for clarity of illustration of the present invention are diagrammatically indicated by the broken lines 16 in FIGS. 1 and 2 as having a more general configuration. In accordance with this invention, the second circuit components 16 are arranged in a second array which preferably comprises a line of the components extending around three sides of the first array as is indicated by centerlines c, d and e.

In a typical embodiment of the invention, the first array 15 includes about 32 shift registers 14 and a corresponding number of input pins 16 to an output buffer or the like, a lesser number of the noted components being shown in FIGS. 1 and 2 for ease and clarity of illustration.

Where the first MOS component 14 comprise shift registers or the like, the registers are preferably organized in a conventional manner so that outputs extend from either end of the register and so that conductors from one register are adapted to extend over, under or through substrate areas accommodating adjacent registers or the like. In accordance with this invention, each of the first MOS circuit components 14 has first diffused regions of other conductivity type such as P-type silicon provided in the substrate 12 for defining first conductors 18 extending from the first components 14. Preferably where the components 14 comprise shift registers as above described, the first conductors 18 extend from each of the outputs of the shift registers at each end of each shift register. In accordance with this invention, the first conductors extend from each first component for a selected limited distance which is less than the spacing of that component from the component 14 in the next adjacent column in the first array 15 as illustrated in FIGS. 1 and 2. Preferably the first conductors are oriented as shown in FIGS. 1 and 2 so that metal conductive paths to be connected to the first conductors preferably extend through zones indicated by pairs of broken lines f—f, g—g and the like which extend across the first array in a direction transverse to the direction in which the array columns extend. In a preferred embodiment of the invention, the components 16 are conveniently illustrated in FIGS. 1 and 2 as having comparable conductors 20 formed by corresponding P-type conductivity areas provided in the substrate. However, it will be understood that the second components 16 are of any conventional type having any conventional means for connection thereto within the scope of this invention.

In accordance with this invention, a plurality of second diffused regions of said other conductivity type such as P-type silicon are provided in the substrate 12 for defining second conductor elements 22 which are arranged in groups 22a, 22b and the like where the number of groups corresponds to the number of second circuit components 16 embodied in the second array. The second conductor elements 22 in each group are sequentially aligned with spaces as indicated at h, j in FIG. 1 so that the elements extend in a line in generally parallel relation to the several columns a of first components 14 in the first array. Preferably as is shown in FIGS. 1 and 2, at least some of the lines 22a, 22b of the second conductor elements extend between columns a of the first components, at least some of the lines 22c, 22d of the elements 22 extend between a column a at one side of the first array and the portion c of the second array, and at least some of the lines 22e, 22f of elements 22 extend between another column a at an opposite side of the first array and a corresponding portion e of the second array. In accordance with this invention, the second conductor elements 22 in each group are located so that individual elements 22 cross under respective zones f—f, g—g along which conductive paths to the first conductors 18 preferably extend.

In a preferred embodiment of the invention, where the conductors 20 from the second array components 16 are formed by diffused regions in the substrate 12 as noted above, the conductors are each directly connected to a second conductor element 22 in a respective group 22a, 22b of the second elements either at an end of the line of elements as indicated at 20.1 in FIG. 1 or by passing through a space h, j or the like as indicated at 20.2 in FIG. 1. Alternately any other conventional means are used for electrically connecting components 16 of the second array with second conductive paths formed by groups of the conductor elements 22 within the scope of this invention.

In accordance with this invention, insulating coating means such as silicon oxide 24 or the like is provided on the substrate 12 in conventional manner so that the coating means extends over the noted diffused regions forming the first conductors 18, the comparable conductors 20, and the second conductive elements 22 and so that contact openings are left in the insulating coating means opening in a common plane as shown in FIG. 1 for permitting electrical connections to be made to the respective conductors and conductive elements. That is, contact openings 26 in the insulating coating means are formed over the remote ends of the first conductors 18 extending from the first components 14 as is indicated in solid lines in FIG. 1, the diffused regions forming the first conductors 18 below the insulating coating means being illustrated by broken lines in FIG. 1. Comparable contact openings 28 are provided in the insulating coating means 24 over each end of the each of the second conductive elements 22.

In that arrangement, the first conductors 18 and the second conductive elements 22 form a metal programmable matrix for use in electrically connecting any of the outputs from the registers 14 to any of the input pins 16 or the like in the integrated circuit unit 10a illustrated in FIG. 1 by programming the integrated circuit 10 at the metal level. That is, as is exemplified in the integrated circuit structure diagrammatically illustrated in FIG. 2, conductive metal means 30 are provided on the insulated coating means 24 in conventional manner so that the metal conductive means are electrically connected in said common plane as shown in FIG. 2 to the first conductors 18 and to comparable conductors 20 and second conductive elements 22 in a selected pattern. Preferably the metal conductive means has first portions 30.1 forming first conductive paths which extend generally lengthwise along the first zones f—f, g—g. The metal conductive means also has second portions 30.2 electrically interconnecting ends of adjacent second conductive elements elements 22 in linear relation to each other within respective groups 22a, 22b and the like for forming second conductive paths which extend in matrix relation to the first conductive paths. The metal means also has third portions 30.3 typically extending in a lateral direction with respect to the zones f—f, g—g as shown for electrically connecting selected first conductive paths with selected adjacent second conductive paths. The first and second metal conductive portions 30.1, 30.2 are typically provided by use of standard portions of a metal programming mask to have the general pattern indicated in FIG. 2 as will be understood and the third metal portions 30.3 are formed by use of other mask portions especially provided in the mask for achieving each desired programming of the integrated circuit unit 10. In that regard, the first conductive paths connected to first conductors 18 of one shift register 14 are adapted to pass over or under adjacent shift registers as may be required or in preferred embodiment as illustrated in FIG. 2, metal conductive portions 30.1 connected to first conductors 18 of one shift register interconnect with additional conductors 32 formed by additional diffused regions of said other conductivity type provided in the substrate 12 so that the the first conductive paths pass through substrate areas allotted to first array components as shown in FIG. 2. As will be understood, contact openings 34 are provided in the oxide coating 24 for preventing such interconnections of the noted segments 32 of the first conductive paths.

Figure 3:
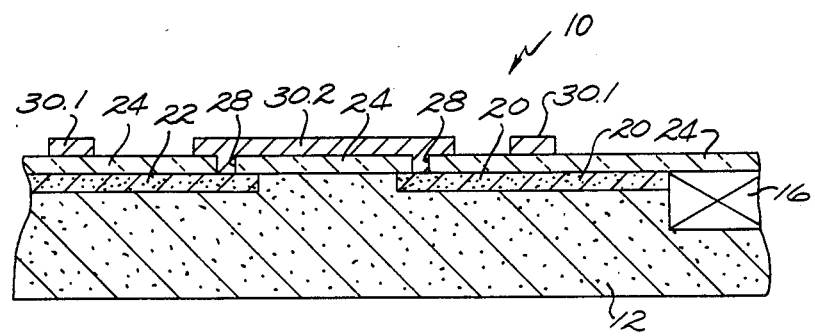
FIG. 3 is a partial section view along line 3.3 of FIG. 2.

As thus described, the metal conductive means 30 conveniently pass over second conductive elements 22 and are electrically insulated therefrom by the insulating coating means 24 as illustrated in FIG. 3 (wherein the illustrated features are shown as being of various different thicknesses for purposes if clarity of illustration). The metal programmable matrix formed by the first conductors 18 and by the conductor elements 22 is compactly and conveniently accommodated in a relatively small area of the substrate 12. The components 14 and 16 of the first and second arrays are also accommodated on the substrate in a compact and inexpensive manner even though the arrays embody a large number of individual components. The metal conductive means 30 is easily provided in the integrated circuit in a compact and economical structure for providing any desired pattern of interconnection between the components of the two arrays. Further, because the program is achieved at the metal level without the need of any additional MOS logic components or the like, basic circuit units are adapted to be prepared in advance in accordance with this invention and then to be conveniently provided with desired interconnection patterns to suit the needs of specific integrated circuit applications as they arise.

It should be understood that although particular embodiments of the integrated circuit and circuit unit of this invention have been described above by way of illustrating the invention, this invention includes all modifications and equivalents of this described embodiments falling within the scope of the appended claims.

I claim:

1. An MOS integrated circuit comprising
    a substrate of semiconducting material of one conductivity type,
    a plurality of MOS circuit components arranged on the substrate to form a first array, and
    a plurality of second circuit components arranged on the substrate to form a second array,
    characterized in that
    the first MOS circuit components are arranged in plurality of columns and rows for forming the first array,
    the second circuit components are arranged in a line extending along at least one side of the first array for forming the second array, the first MOS circuit components each have first diffused regions of other conductivity type provided in the substrate for defining first conductors and have electrically insulating coating means disposed on the substrate over the first conductors, the first conductors extending from each first MOS circuit component for a selected limited distance less than the spacing of said first MOS circuit component from corresponding first MOS circuit components in adjacent columns of the first array so remote ends of the first conductors are disposed under first zones which extend across the electrically insulating coating means over the first array in parallel relation to each other and in transverse relation to said columns of first MOS circuits components in the first array, the electrically insulating coating means having first contact openings therein opening in a common plane over said remote ends of the respective first conductors for permitting electrical connection to the first conductors, a plurality of second diffused regions of said other conductivity types are provided in the substrate under said electrically insulating coating means for defining second conductor elements arranged in respective groups corresponding to each of said second circuit components and having means electrically connecting at least one of the second conductor elements in each group to a respective second circuit component, the second conductor elements in each group being sequentially aligned and spaced to extend in parallel relation to the columns of first MOS circuit components in the first array with at least some of the groups disposed between said columns so that the second conductor elements in each pass under said respective first zones and ends ends of said second conductor elements are disposed outside said first zones which extend across the electrically insulating coating means over the first array, the electrically insulating coating means having second contact openings therein opening in said common plane over ends of each of said second conductor elements for permitting electrical connections to each end of the second conductor elements, and metal means are provided in a single layer in said common plane on the electrically insulating coating means and electrically connected to first conductors and second conductor elements through said first and second contact openings in the electrically insulating coating means, the conductive metal means having first portions connected to selected first conductors through first contact openings for forming first conductive paths extending lengthwise along said first zones, having second portions electrically interconnecting adjacent ends of second conductor elements within said respective groups for forming second conductive paths in matrix relation with said first conductive paths, and having third portions connecting selected first conductive paths with selected adjacent second conductive paths, thereby to provide selected interconnections of said first MOS circuit components and said second circuit components with each other.

2. An MOS integrated circuit as set forth in claim 1 further characterized in that said means electrically connecting each of said second circuit components with at least one of said second conductor elements comprise additional diffused regions of said other conductivity type provided in said substrate directly connected to the respective diffused regions forming said one elements, at least some of said additional diffused regions extending between adjacent pairs of said second conductor elements in said groups.

3. An MOS integrated circuit as set forth in claim 1 further characterized in that the second circuit components are arranged in a line extending along a plurality of sides of the first array in forming said second array.

4. An MOS integrated circuit as set forth in claim 3 further characterized in that said line of second circuit components extends along two sides of the first array parallel to columns of the first MOS circuit components in the first array, and along a third side of the first array parallel to a row of first MOS circuit components in the first array, and said groups of second conductor elements are aligned to extend in parallel relation to the columns of the first MOS circuit components in the first array with at least some of the groups of second conductor elements disposed between said columns of first MOS circuit components and with at least some of the groups of second conductor elements disposed between columns of first MOS circuit components at each of said two sides of the first array and the line of said second components extending along said two sides of the first array for extending along said two sides of the first array for compactly accommodating the arrays and interconnections thereof within the integrated circuit.

5. An MOS integrated circuit as set forth in claim 4 further characterized in that said first MOS circuit components comprise shift registers and said first conductors comprise outputs from the shift registers, and said circuit components comprise integrated circuit terminal means for electrically connecting the register outputs to buffer means.

6. An MOS integrated circuit as set forth in claim 5 further characterized in that selected first portions of said conductive metal means extending from first conductors of selected shift registers in selected rows of said first array extend through other shift registers in selected rows of said first array in extending to be connected to other portions of the conductive metal means.

7. An MOS integrated circuit unit for use in forming an integrated circuit comprising a substrate of semiconducting material of one conductivity type, a plurality of first MOS circuit components arranged on the substrate to form a first array, and a plurality of second circuit components arranged on the substrate to form a second array, characterized in that the first MOS circuit components are arranged in a plurality of columns and rows for forming the first array, the second circuit components are arranged in a line extending along at least one side of the first array for forming the second array, the first MOS circuit components each have first diffused regions of other conductivity type provided in the substrate for defining first conductors and have electrically insulating coating means disposed on the substrate over the first conductors, the first conductors extending from each first MOS circuit component for a selected limited distance less than the spacing of said first MOS circuit component form corresponding first MOS circuit components in adjacent columns of the first array so remote ends of the first conductors are disposed under first zones which extend across the electrically insulating coating means over the first array in parallel relation to each other and in transverse relation to said columns of first MOS circuit components in the first array, the electrically insulating coating means having first contact openings therein opening in a common plane over said remote ends of the respective first conductors for permitting electrical connection to the first conductors, and a plurality of second diffused regions of said other conductivity type are provided in the substrate under said electrically insulating coating means for defining second conductor elements arranged in respective groups corresponding to each of said second circuit components and having means electrically connecting at least one of the second conductor elements in each group to a respective second circuit component, the second conductor elements in each group being sequentially aligned and spaced to extend in parallel relation to the columns of first components in the first array with at least some of the groups disposed between said columns so that the second conductor elements in each group pass under respective first zones and ends of said second conductor elements are disposed outside said first zones which extend across the electrically insulating coating means over the first array, and the electrically insulating coating means having second contact openings therein opening in said common plane over respective opposite ends of each of said second conductor elements for permitting electrical connection to each end of the second conductor elements, whereby conductive metal means are adapted to be provided on the electrically insulating coating means in said common plane and electrically connected to first conductors and second conductor elements through said first and second contact openings in the electrically insulating coating means so that the conductive metal means have first portions forming first conductive paths extending lengthwise along said first zones, have second portions electrically interconnecting adjacent ends of second conductor elements within said respective groups for forming second conductive paths in matrix relation with said first conductive paths, and have third portions extending laterally with respect to said first zones electrically connecting selected first conductive paths with selected adjacent second conductive paths for permitting any desired interconnection of said first MOS circuit components and said second circuit components with each other.

8. An MOS integrated circuit unit as set forth in claim 7 further characterized in that said line of second circuit components extends along two sides of the first array parallel to columns of first MOS circuit components in the first array and along a third side of the first array parallel to a row of first MOS circuit components in the first array, and said groups of second conductor elements are aligned to extend in parallel relation to the columns of first MOS circuit components in the first array with at least some of the groups of second conductor elements disposed between said columns of first MOS circuit components and with at least some of the groups of second conductor elements disposed between columns of first MOS circuit components at each of said two sided of the first array and the line of said second circuit components extending along said two sides of the first array for compactly accommodating the arrays and for compactly accommodating any desired interconnection thereof within an integrated circuit.

9. An MOS integrated circuit unit as set forth in claim 7 further characterized in that said means electrically connecting each of said second circuit components with at least one of said second conductor elements comprise additional diffused regions of said other conductivity type provided in said substrate directly connected to the respective diffused regions forming said one elements, at least some of said additional diffused regions extending between adjacent pairs of second conductor elements in said groups.

* * * * *